(12) United States Patent
Mochida

(10) Patent No.: US 7,193,915 B2
(45) Date of Patent: Mar. 20, 2007

(54) SEMICONDUCTOR MEMORY DEVICE

(75) Inventor: Noriaki Mochida, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 8 days.

(21) Appl. No.: 10/933,290

(22) Filed: Sep. 3, 2004

(65) Prior Publication Data
US 2005/0052909 A1  Mar. 10, 2005

(30) Foreign Application Priority Data
Sep. 4, 2003  (JP)  ............................. 2003-312389

(51) Int. Cl.
*G11C 7/02* (2006.01)
*G11C 7/10* (2006.01)
*G11C 8/00* (2006.01)
*G11C 11/06* (2006.01)

(52) U.S. Cl. ................. 365/206; 365/189.06; 365/214; 365/230.06; 365/244

(58) Field of Classification Search ................. 365/206, 365/214, 230.06, 244, 189.06
See application file for complete search history.

(56) References Cited

U.S. PATENT DOCUMENTS

| | | | | |
|---|---|---|---|---|
| 5,241,503 A | * | 8/1993 | Cheng | ........................ 365/205 |
| 6,134,171 A | * | 10/2000 | Yamagata et al. | ........... 365/229 |
| 6,137,730 A | * | 10/2000 | Chien | ..................... 365/189.02 |
| 6,163,493 A | * | 12/2000 | Yamagata et al. | ........... 365/226 |
| 6,262,585 B1 | * | 7/2001 | Frodsham et al. | ........... 324/763 |
| 6,480,437 B2 | * | 11/2002 | Kato et al. | .............. 365/230.03 |
| 6,668,345 B1 | * | 12/2003 | Ooishi et al. | ................ 714/710 |
| 2001/0052792 A1 | * | 12/2001 | Ooishi et al. | .................. 326/33 |
| 2002/0000624 A1 | * | 1/2002 | Takemura et al. | ........... 257/390 |
| 2003/0112652 A1 | * | 6/2003 | Shimada et al. | ............. 365/154 |
| 2004/0001362 A1 | * | 1/2004 | Muira | ..................... 365/189.05 |
| 2005/0073903 A1 | * | 4/2005 | Fujioka et al. | ............... 365/233 |

FOREIGN PATENT DOCUMENTS

| | | | |
|---|---|---|---|
| JP | 11087649 A | * | 3/1999 |
| JP | 2000-30443 | | 1/2000 |
| JP | 2000-113670 | | 4/2000 |

* cited by examiner

*Primary Examiner*—Amir Zarabian
*Assistant Examiner*—Ly Duy Pham
(74) *Attorney, Agent, or Firm*—McGinn IP Law Group, PLLC

(57) ABSTRACT

When a command is input to a semiconductor memory device, a sub-threshold current is reduced to a predetermined value corresponding to the command. After the reduction of the sub-threshold current is completed, the semiconductor memory device starts to operate corresponding to the command.

22 Claims, 6 Drawing Sheets

SEMICONDUCTOR MEMORY DEVICE

BACKGROUND OF THE INVENTION

1. Field of the Invention

The present invention relates to reduction of power consumption by a semiconductor memory device and in particular to that by a semiconductor memory device in which a layered I/O system is installed.

2. Description of the Related Art

Recently, capacity of a semiconductor memory device is becoming larger, and wiring length in the devices is becoming longer. As a natural result, reading/writing speed to semiconductor memory devices tends to become slower. The layered I/O system is one of the techniques for improving the reading/writing speed.

According to the layered I/O system, a sub-amplifier is arranged on an I/O line connecting between a main amplifier and a sense amplifier in order to compensate the potential of the I/O line and consequently to prevent reduction of the reading/writing speed.

On the other hand, according to a conventional semiconductor memory device, other kinds of problems have occurred. Based on miniaturization of wiring in the memory device, leak current from a MOS transistor with a low threshold becomes larger. Based on increasing capacity of semiconductor memory devices, the number of elements increases, and as a result, standby current of the semiconductor memory device increases. Particularly, a semiconductor memory device with a layered I/O system includes sub-amplifiers, which cause the leak current and the standby current.

In recent years, for DRAMs, it has been more required to increase the capacitance, enhance the processing speed, and reduce the employed voltage. Moreover, the DRAMs have been applied in various new fields, e.g., field of mobile devices. Especially, it is intensively required to reduce power consumption of DRAMs.

According to a technique effective in suppressing the standby current, and thus, can cope with the above-described requirements, a substrate bias effect is applied. According to this technique, the substrate is set at a more negative potential, so that the leak current (sub-threshold current) can be reduced. However, when the potential of the substrate is decreased, the threshold voltage of the transistor increases, so that the operation speed of the transistor is reduced. Accordingly, this technique is not suitable for the case in which high-speed operation is required.

According to another technique for reducing the standby current, a sub-threshold current reduction circuit (SCRC) is used. A SCRC controls a source potential of a transistor when the transistor is on off-state, so that the bias voltage between the gate and the source of the transistor can decrease, and thus, the sub-threshold current is reduced.

Conventionally, various kinds of circuits have been proposed as the target of a SCRC for reducing a sub-threshold current; various kinds of signals are proposed for controlling a SCRC; and timings of inputting a control signal to a SCRC are proposed.

For example, according to the technique described in Japanese Unexamined Patent Publication (JP-A) No. 2000-30443 (hereinafter referred to as a cited reference 1), while switching a standby state to an active state, a SCRC is not applied to a circuit of which the operation starts at relatively early time, although the SCRC is applied to a circuit of which the operation starts at relatively early time when the circuit is in the standby state. Switching between activation and inactivation is made in response to a standby command. According to this technique, a SCRC is inapplicable to a circuit of which the operation starts at relatively early time, for example, to a sub-amplifier on a standby state.

Moreover, according to the technique described in Japanese Unexamined Patent Publication (JP-A) No. 2000-113670 (hereinafter referred to as a cited reference 2), a SCRC is applied to an X decoder while the X decoder is being switched from a standby state to an active state. In a paragraph 0012 of the cited reference 2, it is described "a hierarchic electric source control signal SCRC is activated (high or H level) prior to the activation of the row system operation". However, it is not described in the cited reference 2 that which signal activates the signal SCRC prior to the activation of the row system operation.

SUMMARY OF THE INVENTION

In view of the foregoing, it is an object of the present invention to provide a semiconductor memory device such as DRAM or the like having a layered I/O system containing sub-amplifiers, in which leak current in the sub-amplifiers can be reduced by devising a method of controlling a sub-threshold current reduction circuit (SCRC) as a measure for the reduction of standby current.

It is another object of the present invention to provide a semiconductor memory device that includes a metal mask for selecting, in accordance with type of the semiconductor memory device, e.g. DDR1 or DDR2, a circuit for reducing leak current from the sub-amplifiers.

It is another object of the present invention to provide a semiconductor memory device that can reduce leak current by controlling of a SCRC with a active command and a write command, selecting of a circuit in a SCRC, selecting of a substrate bias voltage, and so forth in combination.

According to one aspect of the present invention, in DRAM or the like having the specifications of DDR-2 and using a layered I/O system containing sub-amplifiers, a sub-threshold current reduction circuit (SCRC) controllable with a command is connected to sources of NMOS transistors which constitute a write buffer in the sub-amplifiers, in order to control the source potentials. The write buffer is used to reduce the potentials of the local I/O lines (LIO) to a low level at high speed.

FIG. 3 shows the configuration of a SCRC and sub-amplifiers in a DRAM according to the present invention. The DRAM includes a layered I/O system and sub-amplifiers on each one of banks 0 to 7. The DRAM further includes SCRCs and a SCRC control circuit for controlling the SCRCs.

Each of the SCRCs includes a NMOS transistor with current supplying capability smaller than that of the write buffer mentioned above. The drain terminal of the NMOS transistor is connected to all of the sub-amplifiers on a bank.

The SCRC control circuit generates a control signal NSC1 for turning the SCRC on-off based on write latency WL information, an act command ACT, a pre-charge command PRE, and a write command WRIT.

For example, in an embodiment described later, the write latency is applied to provide time period for the SCRC recovering, and simultaneously, the act command turns the SCRC off. Thereby, the source potentials of the transistors TN6 and TN7 in the write buffer are lowered to the ground potential. This example is applicable to DDR2, which has a write latency function.

Hereinafter the time period from turning off the SCRC (or raising the level of the SCRC control signal NSC1 to the high level) to lowering the SCRC potential NSC2 to the ground potential is called as a SCRC recovering time. If write latency is enough long, then the time period from inputting a write command to activating sub-amplifiers may be enough longer than the SCRC recovering time. If the time period is enough longer than the SCRC recovering time, then, according to one aspect of the present invention, the write command turns the SCRC off.

In other words, the present invention provides the following semiconductor memory devices.

According to one aspect of the present invention, a semiconductor memory device to which a layered I/O system is applied is provided. The semiconductor memory device includes: a sub-amplifier for the layered I/O system; and a sub-threshold current reduction circuit for reducing a sub-threshold current to be input to the sub-amplifier, wherein, in response to a command for activating memory cell array of the semiconductor memory device, the sub-threshold current reduction circuit reduces the sub-threshold current.

Preferably, the semiconductor memory device may further include: a unit for setting a latency; and a unit for executing the command input to the semiconductor memory device after generating clock signals corresponding to the latency. In this case, the sub-threshold current reduction circuit reduces the sub-threshold current in response to inputting of the command; and the command is executed after the reduction of the sub-threshold current is completed.

Preferably, at least one of an act command, a pre-charge command, and a write command corresponds to the command.

Preferably, the semiconductor memory device may further include: a first transistor; a second transistor having different current supplying capability with that of the first transistor; and a metal mask for selecting, in accordance with type of the memory cell array, one of the first transistor and the second transistor.

Moreover, the semiconductor memory device may further include a metal mask for changing, in accordance with type of the memory cell array, the substrate potential of the transistor for a write buffer in the sub-amplifier. Thereby, the use of the substrate bias effect or the no use thereof can be also selected, depending on the type of the memory cell array.

For example, the type of the memory cell array is one of DDR-1 and DDR-2.

In the standby state, the SCRC control signal controls the source potential of the NMOS transistor which constitutes the SCRC, so that the potential between the gate and the source is reduced. Thereby, the sub-threshold current for the write buffer in the sub-amplifier circuit can be reduced.

As a result, in the layered I/O system containing the sub-amplifiers, the standby currents in power down and self-refreshing can be reduced. Thus, both of the high speed processing and the reduction of the consumed power can be realized.

DESCRIPTION OF THE PREFERRED EMBODIMENTS

According to the present invention, a sub-threshold current reduction circuit SCRC is applied to the write buffers of a sub-amplifier. Conventionally, a SCRC is not applied to sub-amplifiers. According to the present invention, a SCRC is applied to a write buffers of sub-amplifiers, since the transistors used in the write buffer of the sub-amplifier is large, and the number of the sub-amplifiers is large, and thus, the amount of the standby current in the whole of the semiconductor memory device can be effectively suppressed by the reduction of the leak current in the sub-amplifiers.

The reason why the leak current flows in the sub-amplifiers is described below. The complementary I/O lines in the sub-amplifier are in the pre-charge state when no selection is carried out, and are maintained at a high level. For example, regarding a write buffer shown in FIG. 3, when the drains of transistors TN6 and TN7 are at a high level, and their sources are at the ground potential, their gates are at a low level. A sub-threshold current flows through the transistors TN6 and TN7 which have large current-supplying capabilities. That is, leak current flows.

In this state, the SCRC is caused to operate, so that the transistor TN8 of the SCRC is turned off. Thus, the sources NSC2 of the transistors TN6 and TN7 are isolated from the ground potential. The isolated source potential is gradually increased by the sub-threshold-currents of the transistors TN6 and TN7. Thus, the sub-threshold currents cease to flow. Therefore, the leak currents can be reduced by employing the SCRC.

[First Embodiment]

In this embodiment, the operation of a SCRC is controlled by a write command, and the SCRC is applied to write buffers of sub-amplifiers.

Figure 1:
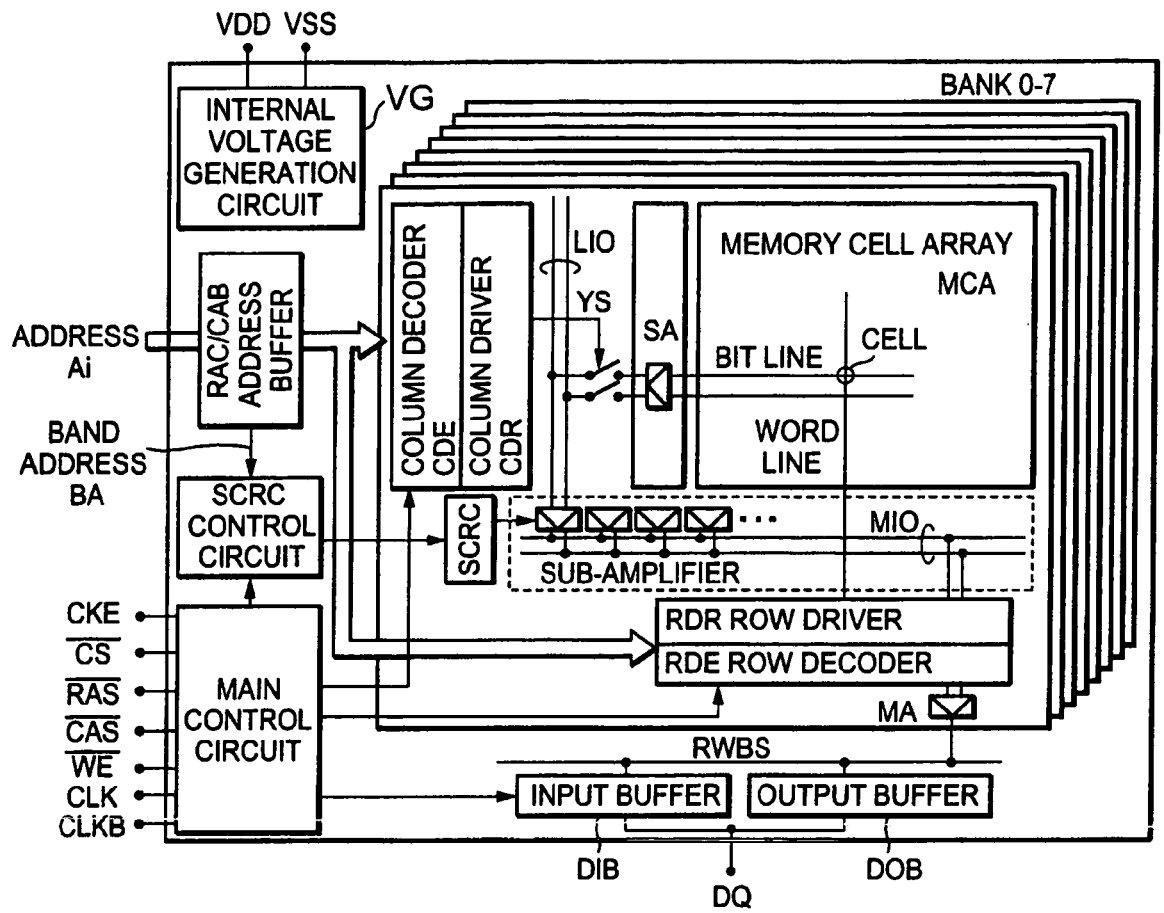
FIG. 1 is a block diagram showing the functions according to a first embodiment of the present invention.

The outline of the configuration of a semiconductor memory device according to this embodiment is described with reference to FIG. 1. Specifically, the semiconductor memory device may be a 1 Gbit DDR-2 SDRAM. The semiconductor memory device includes a memory cell array MCA composed of a plurality of memory cells, address buffers (row address buffer and column address buffer) for designating an address in the memory cell array MCA, a row decoder RDE, a column decoder CDE, a row driver RDR, a column driver CDR, a sense amplifier SA for carrying out the read-write of data, a main amplifier MA, an output buffer DOB, an input buffer DIB, an input buffer DIB to which respective control signals are input, a main control circuit for generating an internal control signal, known units such as an internal voltage generating circuit VG, and so forth. These components are formed on one semiconductor chip by a known semiconductor production technique. It is to be noted that a bank address BA is input from the address buffer to an SCRC control circuit. According to the present invention, the SCRC of a selected bank is controlled by a command and the bank address. Moreover, the SCRC of a non-selected bank, the SCRC is turned on, and thereby, the leak current is suppressed.

An address signal Ai is input to the DRAM from the outside. Thus, a row address signal and a column address signal are generated by the row address buffer RAB and the column address buffer CAB. These signals are processed in the row decoder RDE, the row driver RDR, the column decoder CDE, and the column driver CDR, respectively. Thus, a desired memory cell is selected in the memory cell array MCA.

In read operation, data is given to a read/write bus RWBS via the sense amplifier SA, layered I/O lines LIO and MIO, the sub-amplifiers, and a main amplifier MA. Finally, output data Dout is output from the output buffer DOB. In write operation, input data Din is input through the input buffer DIB.

Figure 2:
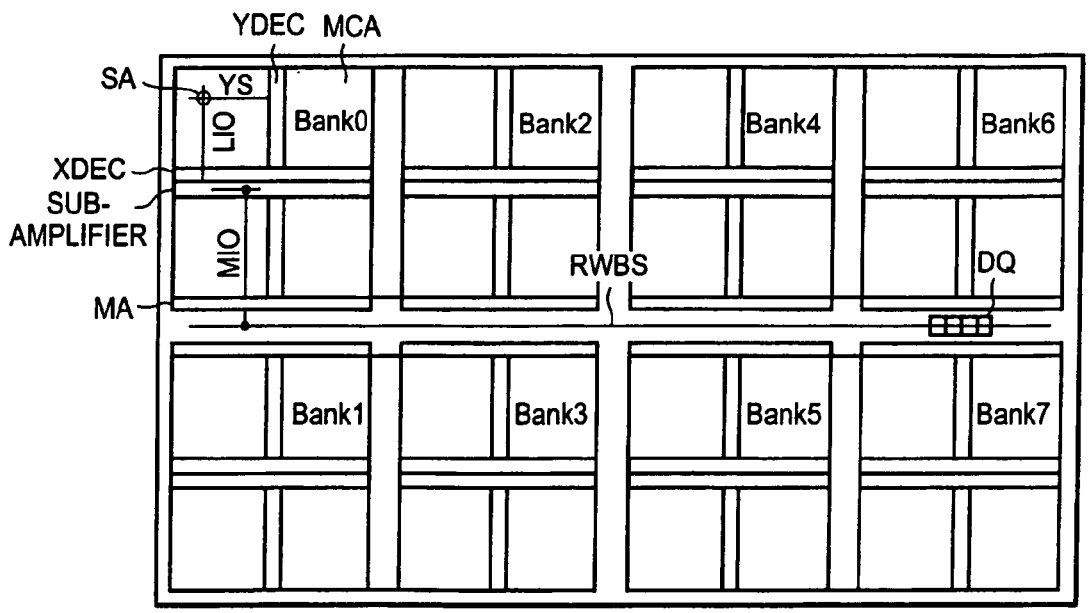
FIG. 2 illustrates an example of a chip layout according to the first embodiment of the pre-charge.

The layered I/O configuration includes the local I/O bus LIO, the main I/O bus MIO, and the sub-amplifiers. The sub-amplifiers are arranged at a halfway point of the I/O line connecting the plural sense amplifiers and the amplifier to each other. Thereby, the potential difference between the I/O line is auxiliarily amplified so that the read/write speed can be prevented from decreasing which occurs due to the increased length of the I/O line. In an example of the chip layout shown in FIG. 2, a sub-amplifier is provided in the center of a bank. The local I/O bus LIO and the main I/O bus MIO use aluminum wirings provided on the memory cell array.

Moreover, as a control signal for the DRAM, a row address strobe signal /RAS, a column address strobe signal /CAS, a write enable signal /WE, and so forth are input via the respective buffers from the outside. Internal control signals are generated based on the above-described control signals. The operation of the internal circuits is controlled by the internal control signals. Referring to an internal electric source system, an external electric source voltage VDD and the ground potential VSS are input from the outside. Various internal voltage levels such as a substrate potential, a voltage-rising electric source potential, a voltage-reducing electric source potential, and so forth are generated in an internal voltage generation circuit VG, and are supplied to the internal circuits such as the memory cell array MCA, the peripheral circuits, and so forth, respectively.

Especially, in addition to the write latency mechanism formed base on the DDR-2 specifications, the layered I/O system containing the sub-amplifiers for auxiliarily amplifying the potential difference between the I/O lines is employed. The control of the source potential for the write buffer in the sub-amplifiers is devised.

Figure 3:
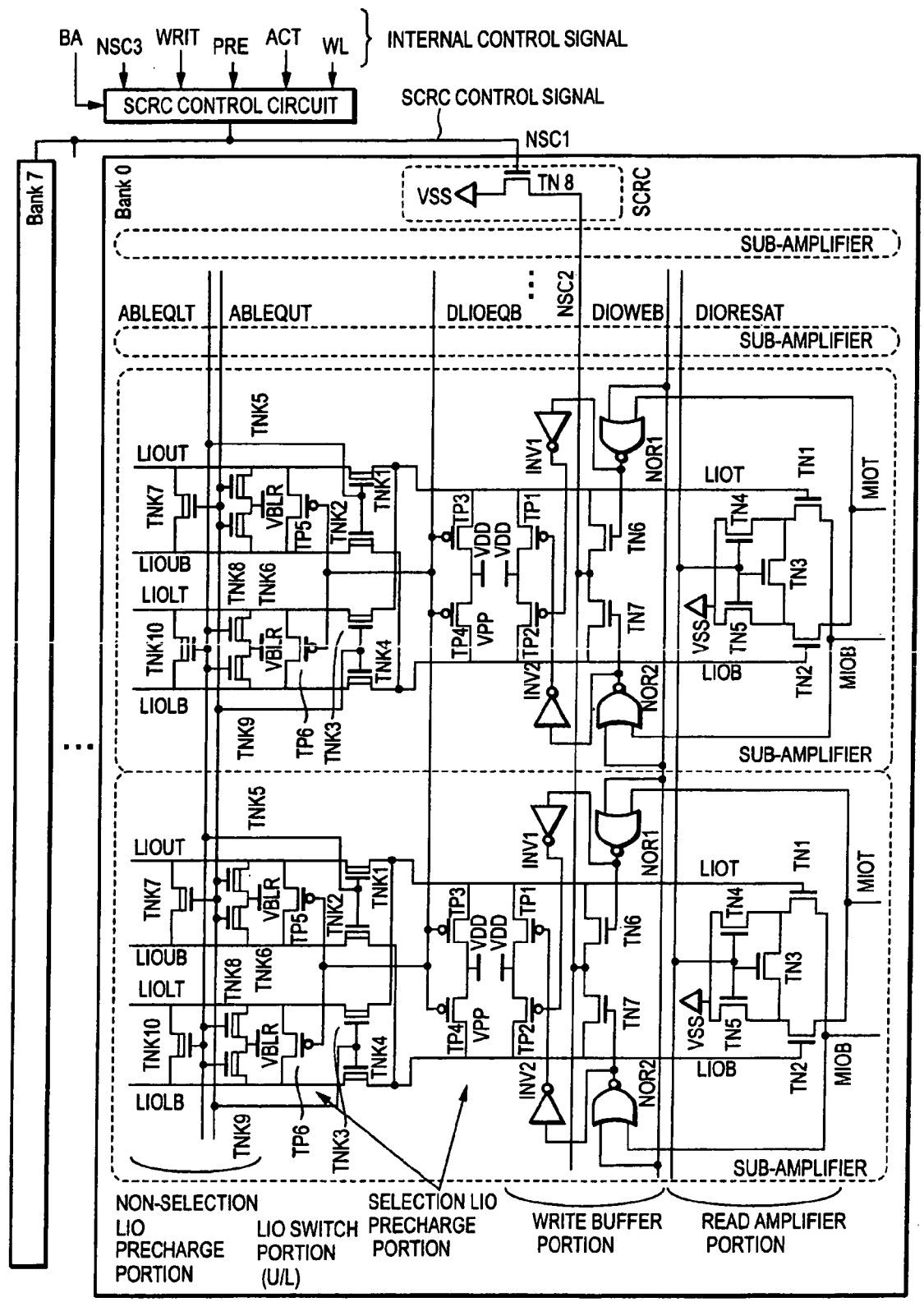
FIG. 3 is a circuit diagram of the sub-amplifiers and the peripheries according to the first embodiment of the present invention.

The semiconductor memory device of this embodiment will be described in detail with reference to FIG. 3. Hereinafter, the description is made on the sub-amplifiers which are divided into the following five regions, depending on the functions of the sub-amplifiers. In particular, the five regions are a read amplifier portion, a write buffer portion, a selection LIO pre-charge portion, an LIO switch portion, and a non-selection LIO pre-charge portion.

When data is read, the read amplifier portion amplifies signals on complementary I/O lines LIOT and LIOB and transmit the amplified signals to complementary main I/O line MIOT and MIOB. The read amplifier portion includes one pair of NMOS transistors TN1 and TN2, and π type NMOS amplifiers TN3, TN4, and TN5, which are connected to the complementary main I/O lines MIOT and MIOB. The gates of the transistors TN1 and TN2 are connected to the complementary local I/O lines LIOT and LIOB in the sub-amplifier circuit. On the other hand, the gates of the transistors TN3, TN4, and TN5 are connected to the line for a read amplifier activation signal DIORESAT.

When data is written in a memory cell, the write buffer portion transmits the date from the complementary main I/O lines to the complementary local I/O lines. The write buffer portion includes a pair of NOR circuits NOR1 and NOR2 connected to the complementary main I/O lines and the line for a write buffer activation signal DIOWEB, a pair of inverter circuits INV1 AND INV2, and a pair of NMOS transistors TN6 and TN7 and a pair of PMOS transistors TP1 and TP2 of which the gates are connected to the output nodes of the circuits NOR1 and NOR2 and to those of the circuits INV1 and INV2, respectively. The drains of the NMOS transistors TN6 and TN7 and the PMOS transistors TP1 and TP2 are connected to the complementary I/O lines LIOT and LIOB in the sub-amplifier circuit.

The sources of the NMOS transistors TN6 and TN7 are connected to a common node in the same bank, i.e., the SCRC potential NSC2, and are connected to the drain of the NMOS transistor TN8 which constitutes the SCRC arranged in each bank. The sources of the PMOS transistors TP1 and TP2 are connected to the electric source potential VDD.

The selection LIO pre-charge portion pre-charges each of the complementary local I/O lines. The selection LIO pre-charge portion includes a pair of PMOS transistors TP3 and TP4 and a pair of PMOS transistors TP5 and TP6. The gates thereof are connected to the line for a local I/O (LIO) equalize signal DLIOEQB. The drains of the PMOS transistors TP3 and TP4 are connected to the complementary local I/O lines LIOT and LIOB in the same sub-amplifier circuit. The sources are connected to the electric source potential VDD. On the other hand, the sources and drains of the PMOS transistors TP5 and TP6 are connected to complementary local I/O lines LIOUT, LIOUB, LIOLT, and LIOLB which are provided outside of the sub-amplifier, the respectively.

The LIO switch portion selects one of a pair of the complementary local I/O line LIOUT and LIOUB and a pair of the complementary local I/O line LIOLT and LIOLB, and connects the selected lines to the complementary local I/O lines LIOT and LIOB, respectively. The LIO switch portion includes two pairs of NMOS transistors, i.e., TNK1, TNK2, TNK3, and TNK4. The gates are connected to the lines for bit line equalize signals ABLEQLT and ABLEQUT. The source of the TNK1 is connected to the complementary local I/O line LIOT, and the drain is connected to the complementary local I/O line LIOUT. The source of the TNK2 is connected to the complementary local I/O line LIOB, and the drain is connected to the complementary local I/O line LIOUB. The source of the TNK3 is connected to the complementary local I/O line LIOT, and the drain is connected to the complementary local I/O line LIOLT. The source of the TNK4 is connected to the complementary local I/O line LIOB, and the drain is connected to the complementary local I/O line LIOLB.

The non-selection LIO pre-charge portion pre-charges the complementary local I/O lines which are not selected by the LIO switch portion. The non-selection LIO pre-charge portion includes two circuits each including three NMOS transistors, i.e., one circuit including TNK5, TNK6, and TNK7, the other circuit including TNK8, TNK9, and TNK10. The gates of the TNK5 and the TNK6 are connected to the bit line equalize signal line ABLEQUT, and the sources are connected to the complementary local I/O lines LIOUT and LIOUB. The drains are connected to an internal generation electric source potential VBLR. The gate of TNK7 is connected to the bit line equalize signal line ABLEQUT. The source and the drain are connected to the complementary local I/O lines LIOUT and LIOUB. Similarly, the gates of the TNK 8 and the TNK 9 are connected to the bit line equalize signal line ABLEQLT, and the sources are connected to the complementary local I/O lines LIOLT and LIOLB. The drains are connected to the internal generation electric source potential VBLR. The gate of the TNK7 is connected to the bit line equalize signal line ABLEQLT, and the source and the drain are connected to the complementary local I/O lines LIOLT and LIOLB.

Referring to an SCRC control circuit, the input signals are a write latency WL, an act command ACT/pre-charge command PRE/write command WRIT, a control signal NSC3, and a bank address BA. The SCRC control circuit outputs an SCRC control signal NSC1 which causes the SCRC to turn the SCRC on-off. The signal NSC1 is supplied to the gate of the NMOS transistor TN8. The write latency is determined by EMRS. Depending on the latency, it is changed over from controlling the SCRC by a write command, to controlling the SCRC by an ACT/PRE command, and vice versa. A bank is selected by the bank address signal. In the selected bank, the on/off of the SCRC is controlled by the above-described command. On the other hand, in a non-selected bank, the SCRC is on. The detailed configuration of the SCRC control circuit is not described.

Hereinafter, the operation of the SCRC made when the SCRC is controlled by the write command is described with reference to FIG. 4.

Regarding the DRAM having the DDR-2 specifications, for effective utilization of the command bus, a write command WRIT and a read command READ can be accepted earlier by time specified by AL (Additive Latency) according to the Posted CAS function. The relationship between the write latency WL, the lead latency RL, the additive latency AL, and the CAS latency CL is defined as WL=RL−1=AL+CL−1.

Figure 4:
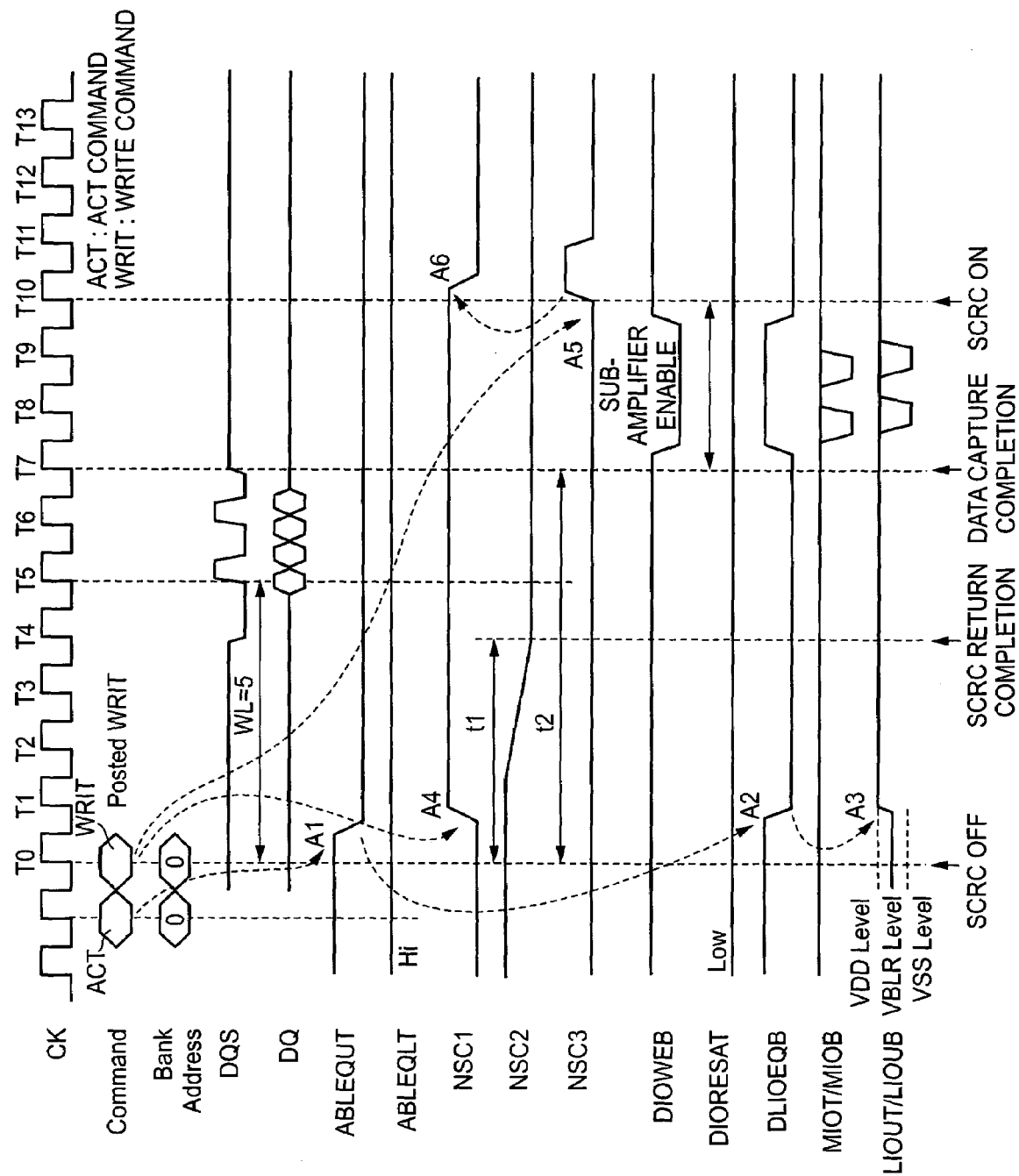
FIG. 4 is a timing diagram illustrating the SCRC operation in the sub-amplifiers according to the first embodiment of the present invention.

FIG. 4 is a timing diagram obtained in the case of a write latency WL=5, which illustrates the operation in which the SCRC in Bank 0 is controlled by the write command, utilizing the write latency. The write latency WL is designated as WL=5 in advance by the operation of Mode Register Set (MRS) and Extended Mode Register Set (EMRS).

In this state, when an act command AC and an address are input, the level of the bit line equalize signal ABLEQUT becomes low (arrow A1).

Correspondingly to this, the transistors TNK3 and TNK4 are turned off, while the TNK1 and the TNK2 continue to be on. The local I/O lines LIOT and LIOB are disconnected from the local I/O lines LIOLT and LIOLB, and are connected to the local I/O lines LIOUT and LIOUB. As a result, the LIO switch portion selects the local I/O lines LIOUT and LIOUB, and connects them to the lines LIOT and LIOB, respectively.

The local I/O lines LIOLT and LIOLB not selected by the LIO switch portion are pre-charged with the internal generation electric source potential VBLR via the transistors TNK8 and TNK9.

When the level of the LIO equalize signal DLIOEQB becomes low, the local I/O lines LIOUT and LIOUB selected by the LIO switch portion is pre-charged with the external electric source potential VDD (arrows A2 and A3).

Subsequently, when the write command WRIT supplied by the Posted CAS is input, the internal control signals WL, ACT, and WRIT are supplied to the SCRC control circuit shown in FIG. 3 in timing synchronous with an internal clock. The level of the SCRC control signal NSC1 becomes high based on these control signals (arrow 4), the SCRC is turned off, the transistor TN8 of the SCRC turns on, and the source potentials of the transistors TN6 and TN7 of the write buffer portion become equal to the ground potential. The duration from the time when the write command is input to the time when the SCRC reduces the source potential of the write buffer in each sub-amplifier so that the output node reaches the ground potential is represented by a return duration t1. Thus, the return of the SCRC is completed the duration t1 after the write command WRIT is supplied to the SCRC control circuit.

After the clock number corresponding to the write latency WL elapses, the burst write starts, and the data strobe signal DQS latches input data DQ. Subsequently, the level of the write buffer activation signal DIOWEB becomes low, and the level of the LIO equalize signal DLOEQB becomes high, and the write buffer portion becomes active.

According to the present invention, characteristically, the posted CAS function is applied to the SCRC control in the DRAM having the DDR-2 specifications. The duration from the time when the write command is input to the time when the sub-amplifiers are activated is represented by t2. The duration t2 sufficiently longer than the duration t1 can be assured.

Then, the input data DQ is supplied to the complementary main I/O MIOT/MIOB via the main amplifier MA, and reaches the sub-amplifiers. The write buffer in the sub-amplifiers reduces the potentials of the complementary I/O lines LIOT/LIOB and LIOUT/LIOUB, depending on whether the level of the data is high or low. Thus, the write data is transmitted to the sense amplifier SA.

When the write operation is completed, the level of the write buffer activation signal DIOWEB becomes high, and that of the LIO equalize signal DLOEQB becomes low, and the sub-amplifiers get into the standby state. Then, when the output node NSC1 of the SCRC control circuit becomes low (arrow A6), the SCRC turns on. Thus, the transistor TN8 is on off, and the source node NSC2 is disconnected from the ground potential. Thus, the sub-threshold current can be reduced during the standby time. In this case, the SCRC can be turned on in timing after the write operation is completed, by inputting a SCRC reset signal NSC3 (arrow A5) or the like to the SCRC control circuit, the signal being generated by an internal clock counter based on the write command.

As described above, in the case of a large write latency WL, the SCRC is controlled by the write command. On the other hand, in the case of a small write latency WL, the SCRC is controlled by an act command ACT and a pre-charge command PRE. This is described below.

Figure 5:
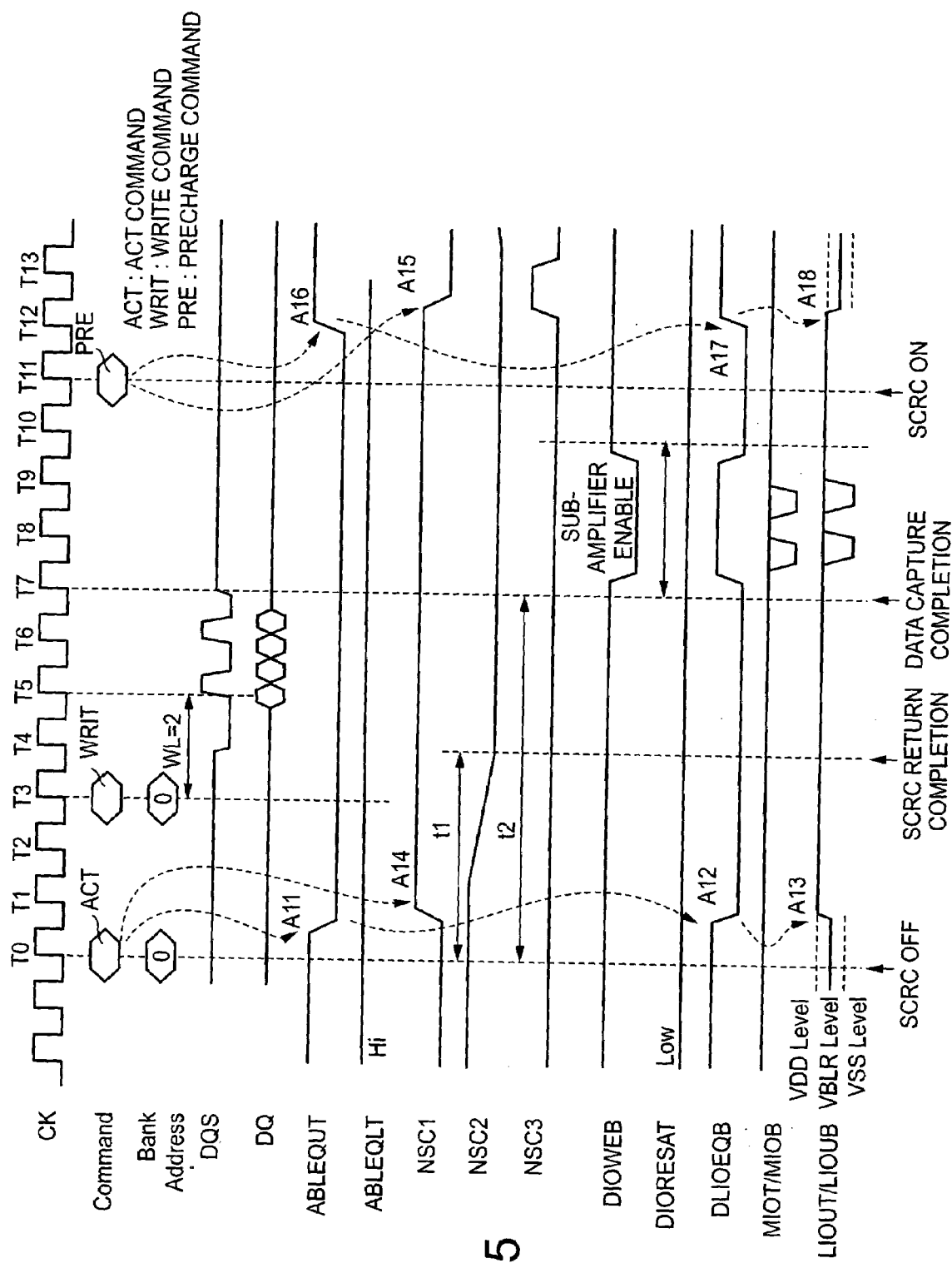
FIG. 5 is a timing diagram illustrating the SCRC operation which is carried out when the write latency is small according to the first embodiment of the present invention.

Referring to the timing diagram shown in FIG. 5, the write layentcy is set at WL=2 in advance by the mode registered set MRS and the extended mode registered set EMRS.

In this state, when the act command ACT and an address signal are input, the level of the bit line equalize signal ABLEQUT becomes low (arrow A11).

Correspondingly to this, the transistors TNK3 and TNK4 are turned off, while the TNK1 and the TNK2 continue to be on. The local I/O lines LIOT and LIOB are disconnected from the local I/O lines LIOLT and LIOLB, and are connected to the local I/O lines LIOUT and LIOUB. As a result, the LIO switch portion selects the local I/O lines LIOUT and LIOUB, and connects them to the lines LIOT and LIOB, respectively.

The local I/O lines LIOLT and LIOLB not selected by the LIO switch portion are pre-charged with the internal generation electric source potential VBLR via the transistors TNK8 and TNK9.

When the level of the LIO equalize signal DLIOEQB becomes low, the local I/O lines LIOUT and LIOUB selected by the LIO switch portion is pre-charged with the external electric source potential VDD (arrows A12 and A13).

The above-described operation of FIG. 5 is the same as that of FIG. 4. However, in the operation of FIG. 4, the level of the SCRC control signal NSC1 becomes high corresponding to the write command WRIT, while in the operation of FIG. 5, the level of the signal NSC1 becomes high corresponding to the act command ACT In particular, when the act command ACT is input, the internal control signals WL, ACT, and WRIT are supplied to the SCRC control circuit shown in FIG. 3 in timing synchronous with the internal clock. The level of the SCRC control signal NSC1 becomes high based on these control signals (arrow 14).

The SCRC is turned off, depending on the change of the SCRC control signal NSC1. That is, the transistor TN8 of the SCRC turns on, and the source potentials of the transistors TN6 and TN7 of the write buffer portion become equal to the ground potential. The duration from the time when the write command is input to the time when the SCRC reduces the source potential of the write buffer portion so that the level of the output node NSC2 is sufficiently low is represented by a return duration t1. Thus, the return of the SCRC is completed the duration t1 after the write command WRIT is input.

The write latency WL is set at WL=2. Thus, the burst write starts two clocks after the write command WRIT is input. The input data DQ is latched by the data strobe signal DPQ. Subsequently, the level of the write buffer activation signal DIOWEB becomes low, the level of the LIO equalize signal DLOEQB becomes high, and the write buffer portion gets into the active state. The required duration from the time when the act command ACT is input to the time when the write buffer portion gets into the active state is represented by t2. The output node NSC2 is required to completely return to the ground potential before the duration t2 elapses.

Referring to the operation illustrated in FIG. 5, the write latency WL is short compared to that in the operation illustrated in FIG. 4. However, the act command ACT preceding the write command WRIT is applied to the SCRC control, so that the sufficiently long duration t2 with respect to the return duration t1 of the SCRC can be assured.

Subsequently, the input data DQ is supplied to the complementary I/O line MIOT/MIOB via the main amplifier MA, and reaches the sub-amplifiers. Here, the write buffer in the sub-amplifiers reduces the potentials of the complementary local I/O lines LIOT/LIOB and LTOUT/LIOUB, depending on whether the level of the data is high or low, and transmits the write data to the sense amplifier SA.

After the write operation is completed, the pre-charge command PRE is input. The SCRC control circuit causes the level of the SCRC control signal NSC1 to be low (arrow A15) and turns on the SCRC, corresponding to the pre-charge command PRE. That is, the transistor TN8 gets into the off state, the NSC2 which is the source node of the transistors TN6 and TN7 in the write buffer portion is disconnected from the ground potential.

The level of the bit line equalize signal ABLEQUT becomes high corresponding to the pre-charge command PRE (arrow A16). In correspondence to the level of the pre-charge command PRE becoming high, the transistors TNK3 and TNK4 turn on. When the level of the LIO equalize signal DLIOEQB becomes high (arrow A17), the local I/O lines LIOT/LIOB are pre-charged with the internal generation electric source potential VBLR (arrow 18).

Accordingly, when the sub-amplifier is in the standby state, the SCRC is turned on, and the sub-threshold current from the write buffer is suppressed. When the sub-amplifiers are in the active state, the SCRC is turned off, and the write buffer potential is reduced to the ground potential VSS. Thus, the sub-amplifiers are activated.

As described above, according to the present invention, the on-off of the SCRC is carried out by the command-control in timing synchronous with an internal clock, and thereby, the reduction of the standby current can be realized.

Moreover, regarding the SCRC control according to the present invention, when the write latency WL is large, the SCRC is controlled by the write command. On the other hand, when the write latency WL is small, the SCRC is controlled by the pre-charge command PRE. That is, the control signals for the SCRC are changed over, depending on the numerical values of the write latency WL input to the SCRC control circuit. Thus, the SCRC is controlled.

As described above, the duration involving the return duration of the SCRC as a latency is set, and thereby, the SCRC control can be carried out by the act command and the write command. Therefore, the leak current of the sub-amplifiers in the active-standby can be also reduced. It should be noted that according to the known technique by which the SCRC is controlled by a CKE signal only at self-refreshing, the leak current of the sub-amplifiers generated in the active-standby can not be reduced.

[Second Embodiment]

Figure 6:
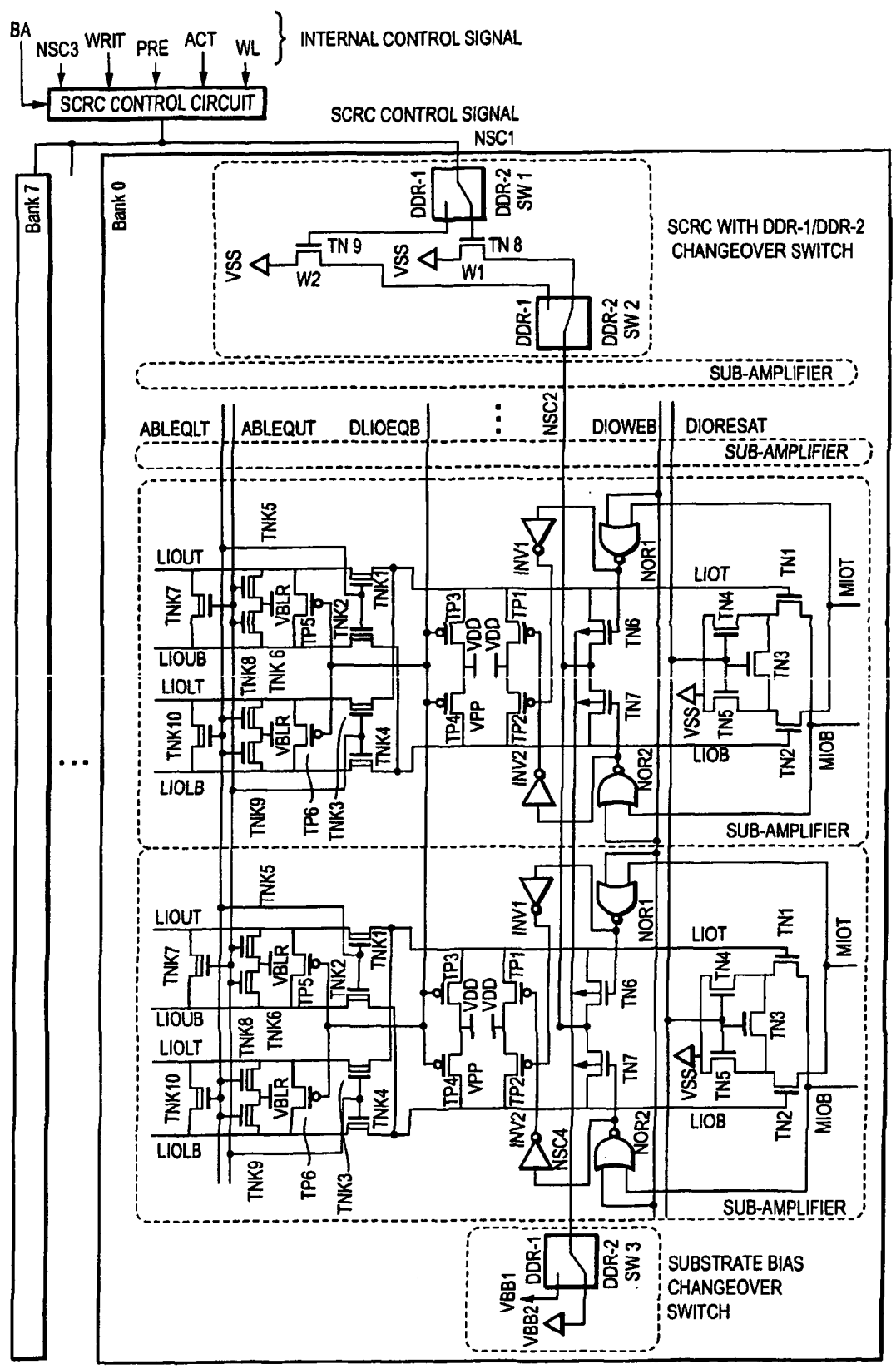
FIG. 6 is a circuit diagram of the sub-amplifiers and the peripheries according to the second embodiment of the present invention.

A second embodiment of the present invention will be described with reference to FIG. 6. The basic constitution is the same as that of the first embodiment. In the DDR-1/DDR-2 combined-mounted DRAM, the SCRC configuration is further devised so as to be suitable for the DDR-1 specifications.

According to the DDR-1 specifications, the write latency WL is fixed at WL=1. Thus, in contrast to the first embodiment, the duration required to return the source potential of the transistors TN6 and TN7 in the write buffer portion to the ground potential can not be assured by setting the write latency at a long duration as in the first embodiment. Therefore, it is necessary to return the source potential to the ground potential earlier.

Therefore, according to this embodiment, in the case of coping with the DRAM having the specifications of DDR-1, the SCRC operation can be carried out with transistors having larger current supplying capabilities, specifically, having larger gate widths, compared to those of the transistors used to cope with the DRAM having the DDR-2 specifications.

On the other hand, the basic clock frequency according to the DDR-1 specifications is low than that according to the DDR-2 specifications. In the case of the SCRC configuration to cope with the DDR-1 specifications only, the current supplying capability required for the TN6 and the TN7 may be relatively small compared to the SCRC configuration coping with the DDR-2 specifications, only.

Therefore, in the case of the SCRC configuration to cope with the DRAM having the DDR-1 specifications, the substrate bias potentials of the transistors TN6 and TN7 are set to be more negative, so that the threshold voltage is set to be high.

In particular, according to the second embodiment, the SCRC is provided with a DDR-1/DDR-2 changeover switch and a substrate bias changeover switch.

The SCRC provided with the DDR-1/DDR-2 changeover switch includes two transistors having different current supplying capabilities, i.e., MOS transistors TN8 and TN9, and metal masks SW1 and SW2. The cases of the DDR-2 and DDR-1 specifications can be changed over.

In the case of the DDR-1 specifications, the transistor TN9 is selected using both of the metal masks SW1 and SW2. In the case of the DDR-2 specifications, the transistor TN8 is selected using both of the metal masks SW1 and SW2.

The gate widths of the transistors TN8 and TN9 are represented by W1 and W2, which have a relationship of W1<W2. For example, the gate width W2 is set at twice the gate width W1. In the case of the DDR-2 specifications, the transistor TN8 is connected. In the case of the DDR-1 specifications, the transistor TN9 is connected. In the write buffer portion in the sub-amplifiers, the source sides of the NMOS transistors TN6 and TN7 are connected to the node NSC2.

That is, the transistor having a larger size is used for the DDR-1 specifications. In the case in which the transistor having a larger size is used, the source potentials of the transistors TN6 and TN7 can be easily reduced to the ground potential compared to the case in which transistors having a small size are used. Thus, the return duration time can be reduced.

However, when the gate widths of the transistor constituting the SCRC are increased, the leak currents in the transistors TN6 and TN7 of the write buffer portion become large. To cancel out the increasing amount of the leak currents and further reduce the leak currents, the substrate potentials of the transistors TN6 and TN7 are changed over by means of a substrate bias changeover switch and the metal masks in such a manner that in the case of the DDR-2 specifications, the potentials become the VBB2, and in the case of the DDR-1 specifications, the potential becomes the VBB1. The potentials VBB1 and VBB2 have a relationship represented by VBB2>VBB1. For example, the potentials VBB2 and VBB1 are set at 0.0 V and −0.5 V.

When the substrate potentials of the transistors TN6 and TN7 are decreased, the leak currents are reduced due to the substrate bias effect, and the operation speeds of the transistors TN6 and TN7 decrease. However, the reduction of the speeds is not a problem, since the high speed is not so much required for the DDR-1 specifications compared to that for the DDR-2 specifications.

The relationship between the drain current of a transistor and the gate-source voltage Vgs in the case of the DDR-1 specifications will be qualitatively explained. The transistor TN9 is selected by the changeover using the metal masks SW1 and SW2 of the SCRC with the DDR-1/DDR-2 specification changeover switch. Thereby, the SCRC effect by the transistor TN9 can be obtained (arrow B1). Moreover, the ground voltage is set at a potential VBB1 by means of the substrate bias changeover switch SW3. Thereby, the reduction effect of the leak current (arrow B2) is obtained due to the substrate bias effect. As a whole, the leak current reduction effect represented by the sum (arrow B3) of the components in the longitudinal direction shown by the arrows B1 and B2 is obtained.

In the case in which the DRAM having the DDR-2 specifications of DDR-2 is used as a memory cell array, the transistor TN6 is selected by means of the metal masks SW1 and SW2 of the SCRC with the DDR-1/DDR-2 specification changeover switches, and also the potential VBB2 is selected by means of the substrate bias changeover switch SW3. The operation carried out in this case is the same as that in the first embodiment, and the description is not repeated.

As described above, according to this embodiment, for both of the cases of the DDR-1 and DDR-2 specifications, the leak currents can be reduced by the simple changeover carried out using the metal masks.

For example, the SCRC is controlled by the act command ACT and the pre-charge command PRE in the DDR-1/DDR-2 combined-mounted DRAM. Thereby, the standby currents, i.e., the standby current IDD2P in power down, the standby current IDD2N in no power down, and the self-refresh current IDD6 can be reduced. Moreover, the active standby current IDD3P in power down and the active standby current IDD3N in non-power-down can be reduced, caused by the substrate bias effect.

Table 1 summarizes an example of the method of controlling the SCRC according to the present invention. It is estimated that in all of the sub-amplifiers, the leak current of the transistors TN6 and TN7 in the write buffer portion can be reduced by 5.5 (nA/um)×16000 (um)×8 (Bank)=0.70 mA.

Figure 7:
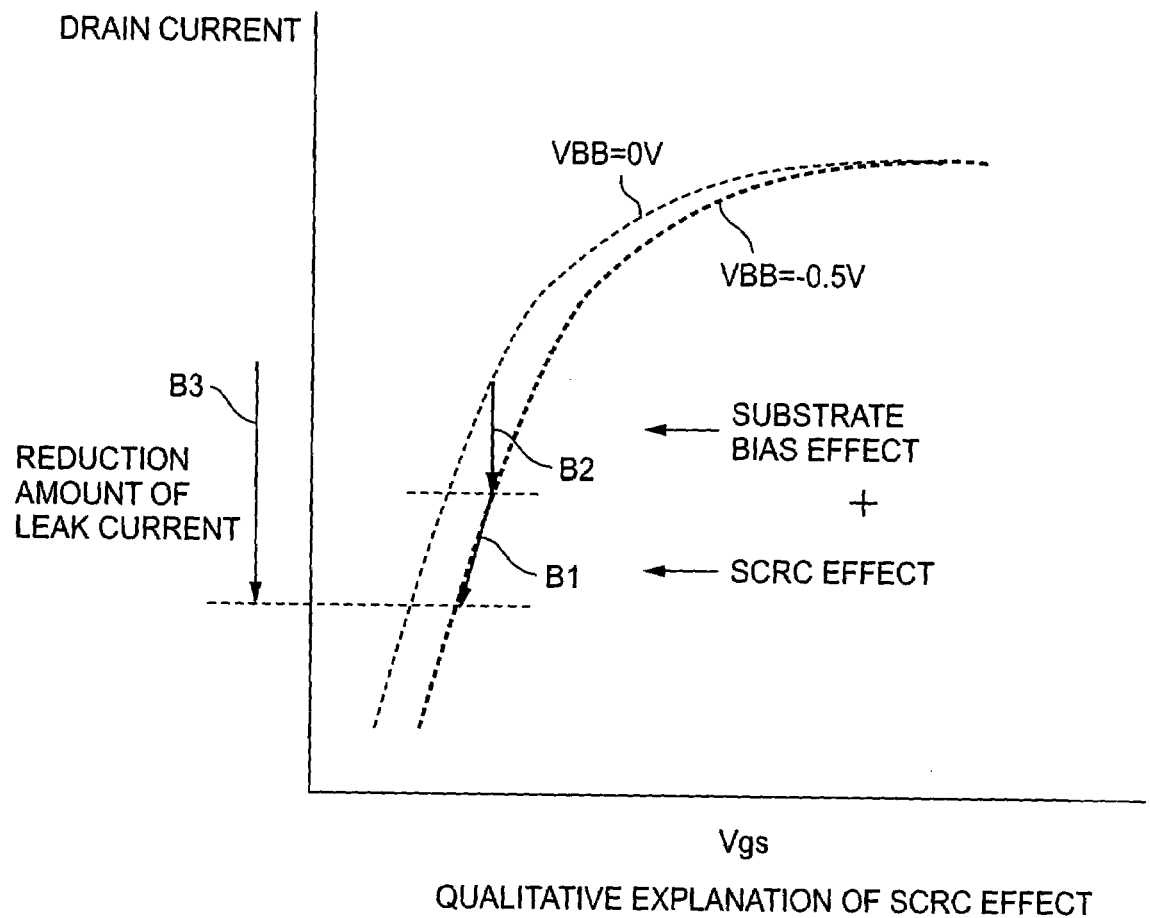
FIG. 7 is a graph showing the reduction amount of leak current according to the present invention.

Advantages obtained according to the present invention and the embodiments will be described with reference to FIG. 7 briefly. In Table 1, IDD2P represents standby current in power down, IDD2N represents standby current in non power down, IDD3P represents active standby current in power down, IDD3N represents active standby current in non power down, and IDD6 represents self-refreshing current.

TABLE 1

| | WL | SCRC SWITCH ON | SCRC SWITCH OFF | SCRC TRANSISTOR SIZE RATIO | SUB-AMPLIFIER SUBSTRATE BIAS POTENTIAL | IDD2P 6 mA −0.7 mA | IDD2N 25 mA −0.7 mA | IDD3P SPEC 30 mA SCRC EFFECT −0.7 mA | IDD3N 58 mA −0.7 mA | IDD6 3 mA −0.7 mA |
|---|---|---|---|---|---|---|---|---|---|---|
| DDR-1 | 1 | ACT | PRE | 2 | −0.5 V | ○ | ○ | Δ | Δ | ○ |
| DDR-2 | 2 | ACT | PRE | 1 | 0 V | ○ | ○ | x | x | ○ |
| | 3 | ACT | PRE | 1 | 0 V | ○ | ○ | x | x | ○ |
| | 4 | WRITE | WRITE | 1 | 0 V | ○ | ○ | ○ | ○ | ○ |
| | 5 | COMMAND | OPERA- | 1 | 0 V | ○ | ○ | ○ | ○ | ○ |
| | 6 | INPUT | TION | 1 | 0 V | ○ | ○ | ○ | ○ | ○ |

TABLE 1-continued

| | SCRC SWITCH | SCRC SWITCH | SCRC TRANSISTOR SIZE | SUB-AMPLIFIER SUBSTRATE BIAS | IDD2P | IDD2N | IDD3P | IDD3N | IDD6 |
|---|---|---|---|---|---|---|---|---|---|
| | | | | | 6 mA | 25 mA | SPEC 30 mA | 58 mA | 3 mA |
| | | | | | | | SCRC EFFECT | | |
| WL | ON | OFF | RATIO | POTENTIAL | −0.7 mA | −0.7 mA | −0.7 mA | −0.7 mA | −0.7 mA |
| | | COMPLETION | | | | | | | |

(1) In the case of the DDR-2 specifications (write latency=4 to 6), the write latency WL is large. Thus, the duration ranging from the input of the write command to the activation of the sub-amplifiers is large than the return duration of the SCRC. Thus, the SCRC can be set by the write command. On the other hand, the SCRC reset can be carried out after the write operation is completed, using the write command and an SCRC reset signal NSC3 generated in the internal clock counter. Thereby, the standby currents IDD2P, IDD2N, IDD6, and also the standby currents IDD3P and IDD3N can be reduced (first embodiment).

(2) In the case of the DDR-2 specifications (write latency WL=2 to 3, the duration ranging form the input of the ACT command to the activation of the sub-amplifiers are larger than the return duration of the SCRC. Thus, the SCRC can be set by the ACT command. On the other hand, the reset of the SCRC is carried out in timing synchronous with the internal clock by the PRE command. Therefore, the standby currents IDD2P, IDD2N and IDD6 can be reduced (first embodiment).

(3) In the case of the DDR-1 specifications, the duration of from the input of the ACT command to the activation of the sub-the amplifiers is short. Thus, the SCRC having a short return duration and a large constant is used by the changeover with the metal masks. Simultaneously, the sub-amplifier substrate potential is reduced, so that the substrate bias effect is also utilized. Therefore, in the case of the DDR-1 specifications, the leak current can be reduced.

For example, in the DDR-1/DDR-2 specification combined-mounted DRAM, the size of the SCRC transistor is increased by two times, the sub-amplifier substrate potential VBB is set at −0.5 V by the changeover of the metal masks. Then, the SCRC is controlled by the ACT command and the pre-charge command PRE. In this case, the standby currents IDD2P, IDD2N, and IDD6 can be reduced. Moreover, the reduction of the standby currents IDD3P and IDD3N can be realized, due to the substrate bias effect (second embodiment).

The present invention has been described above with reference to the embodiments. The present invention is not restricted to the embodiments. Needless to say, modifications and improvements can be made without the ordinary knowledge of the skilled in this field.

What is claimed is:

1. A semiconductor memory device to which a layered I/O system is applied, comprising:
    a sub-amplifier for the layered I/O system; and
    a sub-threshold current reduction circuit for reducing a sub-threshold current to be input to the sub-amplifier,
    wherein, a control signal turns on the sub-threshold current reduction circuit to reduce the sub-threshold current, and turns off the sub-threshold current reduction circuit to stop reducing the sub-threshold current when said sub-amplifier for the layered I/O system is in operation.

2. The semiconductor memory device claimed in claim 1, further comprising:
    means for setting a latency; and
    means for executing the command input to the semiconductor memory device after generating clock signals corresponding to the latency,
    wherein:
    the sub-threshold current reduction circuit reduces the sub-threshold current in response to inputting of the command; and
    the command is executed after the reduction of the sub-threshold current is completed.

3. The semiconductor memory device claimed in claim 1, wherein at least one of an act command, a pre-charge command, and a write command corresponds to the command.

4. The semiconductor-memory device claimed in claim 1, wherein said sub-threshold current reduction circuit further comprises:
    a first transistor;
    a second transistor having different current supplying capability than that of the first transistor; and
    a metal mask for selecting, in accordance with a type of the memory cell array, one of the first transistor and the second transistor.

5. The semiconductor memory device claimed in claim 1, further comprising a metal mask for changing, in accordance with a type of the memory cell array, a substrate potential of a transistor for a write buffer in the sub-amplifier.

6. The semiconductor memory device claimed in claim 4, wherein the type of the memory cell array comprises one of DDR-1 and DDR-2.

7. The semiconductor memory device claimed in claim 5, wherein the type of the memory cell array comprises one of DDR-1 and DDR-2.

8. The semiconductor memory device claimed in claim 4, further comprising a second metal mask for selecting, in accordance with the type of the memory cell array, one of the first transistor and the second transistor.

9. The semiconductor memory device claimed in claim 4, wherein at least one of an act command, and a pre-charge command corresponds to the command.

10. The semiconductor memory device claimed in claim 1, wherein a write latency is between 4 to 6, and the sub-threshold current reduction circuit is set by a write command.

11. The semiconductor memory device claimed in claim 10, wherein the sub-threshold current reduction circuit is reset by the write command and a reset signal generated in an internal clock counter.

12. The semiconductor memory device claimed in claim 1, wherein a write latency is between 2 to 3, and the sub-threshold current reduction circuit is set by an act command.

13. The semiconductor memory device claimed in claim 12, wherein the sub-threshold current reduction circuit is reset by timing synchronous with an internal clock counter by the pre-charge command.

14. The semiconductor memory device claimed in claim 1, wherein control signals for the sub-threshold current reduction circuit are changed over depending on numerical values of a write latency input into the sub-threshold current reduction circuit.

15. The semiconductor memory device claimed in claim 1, wherein a return duration of the sub-Threshold current reduction circuit as a latency is set allows control of the sub-threshold current reduction circuit to be carried out by an act command or a write command.

16. The semiconductor memory device claimed in claim 1, wherein the setting and resetting of the sub-threshold current reduction circuit is carried out by the command in timing synchronous with an internal clock.

17. The semiconductor memory device claimed in claim 4, further comprising a second metal mask for changing, in accordance with a type of the memory cell array, a substrate potential of a transistor for a write buffer in the sub-amplifier.

18. A semiconductor memory device to which a layered I/O system is applied, comprising:
a sub-amplifier for the layered I/O system; and
means for reducing a sub-threshold current to be input to the sub-amplifier,
wherein, a control signal turns on the means for reducing to reduce the sub-threshold current, and turns off the means for reducing to stop reducing the sub-threshold current when said sub-amplifier for the layered I/O system is in operation.

19. A method for reducing a sub-threshold current in a semiconductor memory device to which a layered I/O system is applied, the method comprising:
providing a sub-amplifier for the layered I/O system;
activating a memory cell array of the semiconductor memory device;
reducing a sub-threshold current to be input to the sub-amplifier in response to a command for activating the memory cell array of the semiconductor memory device; and
stopping the reduction of a sub-threshold current to be input to the sub-amplifier when said sub-amplifier for the layered I/O system is in operation.

20. The method for reducing a sub-threshold current in a semiconductor memory device according to claim 19, further comprising:
setting a latency; and
executing the command input to the semiconductor memory device after generating clock signals corresponding to the latency.

21. The semiconductor memory device claimed in claim 1, wherein said sub-threshold current reduction circuit is applied to a write buffer of said sub-amplifier.

22. The semiconductor memory device claimed in claim 21, wherein said sub-threshold current reduction circuit comprises a transistor having a drain connected to a source of a transistor in said write buffer.

* * * * *